United States Patent
Saadatmand et al.

(10) Patent No.: US 6,635,890 B2
(45) Date of Patent: Oct. 21, 2003

(54) SLIT DOUBLE GAP BUNCHER AND METHOD FOR IMPROVED ION BUNCHING IN AN ION IMPLANTATION SYSTEM

(75) Inventors: Kourosh Saadatmand, Beverly, MA (US); William F. DiVergilio, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/224,779

(22) Filed: Aug. 21, 2002

(65) Prior Publication Data

US 2003/0038254 A1 Feb. 27, 2003

Related U.S. Application Data

(60) Provisional application No. 60/314,417, filed on Aug. 23, 2001.

(51) Int. Cl.[7] .............................................. H01J 37/317
(52) U.S. Cl. .............................. 250/492.21; 250/396 R; 250/505.1; 250/398; 315/505; 315/507
(58) Field of Search ...................... 250/492.21, 396 R, 250/505.1, 398; 315/505, 507

(56) References Cited

U.S. PATENT DOCUMENTS

| | | | |
|---|---|---|---|
| 4,419,584 A | 12/1983 | Benveniste | |
| 4,667,111 A | 5/1987 | Glavish et al. | |
| 4,712,042 A | 12/1987 | Hamm | |
| 5,189,302 A | 2/1993 | Roberts et al. | |
| 5,339,336 A | 8/1994 | Sudan | |
| 5,504,341 A | 4/1996 | Glavish | |
| 5,637,879 A | * 6/1997 | Schueler | 250/492.21 |
| 5,703,375 A | 12/1997 | Chen et al. | |
| 5,736,743 A | 4/1998 | Benveniste | |
| 5,998,798 A | 12/1999 | Halling et al. | |
| 6,423,976 B1 | * 7/2002 | Glavish et al. | 250/492.21 |
| 6,583,429 B2 | * 6/2003 | Saadatmand et al. | 250/492.21 |

* cited by examiner

Primary Examiner—John R. Lee
Assistant Examiner—James Leybourne
(74) Attorney, Agent, or Firm—Eschweiler & Associates, LLC

(57) ABSTRACT

An ion buncher stage for a linear accelerator system is disclosed for bunching ions in an ion implantation system. The ion buncher stage may be employed upstream of one or more accelerating stages such that the loss of ions in the linear accelerator system is reduced. The invention further includes an asymmetrical double gap buncher stage, as well as a slit buncher stage for further improvement of ion implantation efficiency. Also disclosed are methods for accelerating ions in an ion implanter linear accelerator.

16 Claims, 9 Drawing Sheets

SLIT DOUBLE GAP BUNCHER AND METHOD FOR IMPROVED ION BUNCHING IN AN ION IMPLANTATION SYSTEM

RELATED APPLICATION

This application claims priority to U.S. Ser. No. 60/314,417 filed Aug. 23, 2001, which is entitled "Slit Double Gap Buncher and Method for Improved Ion Bunching in an Ion Implantation System", which is incorporated herein by reference in its entirety.

FIELD OF THE INVENTION

The present invention relates generally to ion implantation systems, and more specifically to methods and apparatus for improved ion bunching in an ion implantation system.

BACKGROUND OF THE INVENTION

In the manufacture of semiconductor devices, ion implantation is used to dope semiconductors with impurities. A high energy (HE) ion implanter is described in U.S. Pat. No. 4,667,111, assigned to the assignee of the present invention, which is hereby incorporated by reference as if fully set forth herein. Such HE ion implanters are used for deep implants into a substrate in creating, for example, retrograde wells. Implant energies of 1.5 MeV (million electron volts), are typical for such deep implants. Although lower energy may be used, such implanters typically perform implants at energies between at least 300 keV and 700 keV. Some HE ion implanters are capable of providing ion beams at energy levels up to 5 MeV.

Referring to FIG. 1, a typical high energy ion implanter 10 is illustrated, having a terminal 12, a beamline assembly 14, and an end station 16. The terminal 12 includes an ion source 20 powered by a high voltage power supply 22. The ion source 20 produces an ion beam 24 that is provided to the beamline assembly 14. The ion beam 24 is then directed toward a target wafer 30 in the end station 16. The ion beam 24 is conditioned by the beamline assembly 14 that comprises a mass analysis magnet 26 and a radio frequency (RF) linear accelerator (linac) 28. The linac 28 includes a series of accelerating modules 28a–28n, each of which further accelerates ions beyond the energies they achieve from prior modules. The accelerating modules maybe individually energized by a high RF voltage that is typically generated by a resonance method to keep the required average power reasonable. The mass analysis magnet 26 passes only ions of an appropriate charge-to-mass ratio to the linac 28.

The linear accelerating modules 28a–28n in the high energy ion implanter 10 individually include an RF amplifier, a resonator, and an energizable electrode. The resonators, for example, as described in U.S. Pat. No. 4,667,111 operate at a frequency in the range of about 3–30 Mhz, with a voltage of about 0 to 150 kV, in order to accelerate ions of the beam 24 to energies over one million electron volts per charge state. As the ion beam 24 travels through the various accelerating modules is or stages 28, some of the ions therein are properly accelerated, whereas others are not. Thus, conventional linear accelerators 28 achieve an ion acceleration efficiency that is less than 100%. In particular, conventional ion accelerators may deliver less than 20% of the ions from the mass analysis magnet 26 to the target wafer 30 in the end station 16. In particular, each ion accelerating stage 28a–28n is tuned or adjusted in order to provide appropriate acceleration to ions provided thereto which fall within a tolerance or acceptance range. Maintaining ions in an ion beam is facilitated where the ions are bunched or packetized prior to acceleration, whereby a larger percentage of ions are accelerated by each accelerating module or stage 28. In conventional linear accelerators 28, the first or the first and second accelerating modules (e.g., modules 28a, 28b) may operate as a combination buncher and accelerator. However, this bunching provides limited ion transfer efficiency. Thus, typical linear accelerators 28 may achieve less than 20% transmission of ions. In ion implantation devices, it is desirable to impart ions onto a workpiece, such as a semiconductor product, in a controlled fashion. In conventional systems where approximately 80% of ions generated by an ion source therein may be lost (e.g., not provided to the workpiece), more time is needed to perform the desired implantation. Thus, there is a need for improved methods and apparatus for bunching ions in an ion implantation linear accelerator, in order to increase the percentage of generated ions that are imparted onto a workpiece.

SUMMARY OF THE INVENTION

The present invention is directed to a linear accelerator having an ion buncher associated therewith that achieves improved ion transport in an ion implantation system. The invention provides a dedicated buncher stage for ensuring that a greater percentage of the generated ions are provided in the region of acceleration for the accelerating stage of the ion implanter, than was heretofore possible. The buncher stage may be positioned upstream of a linear accelerator stage along a beam path in an ion implantation system in order to provide bunches or packets of ions to the accelerating stage of the accelerator. In particular, the invention provides for beam transmission of up to 60%, for example, of the available ions through the linear accelerator of an ion implantation system. Thus, the invention provides significant advantages over conventional ion implantation devices and methodologies in which in some cases less than 20% of available ions were properly accelerated.

One aspect of the invention provides an asymmetrical double gap buncher providing further advantages and efficiencies associated with ion transfer in an ion implantation system. First and second gaps are provided before and after a buncher modulating electrode, respectively, wherein the gaps differ in size, for example, wherein the second gap is larger than the first gap.

The modulating field in the buncher accelerates certain ions with respect to a reference ion, and decelerates others with respect thereto. In the drift region, the accelerated ions catch up to the reference ion and the decelerated ions slow down to allow the reference ion (e.g., as well as the accelerated ions) to catch up, thereby providing a net bunching effect. The asymmetry of the gaps facilitates the provision of a higher percentage of available ions to subsequent linear accelerator stages, thereby significantly improving the ion transfer efficiency of ion implantation systems. The asymmetrical double gap buncher may be included as a buncher stage within a linear accelerator system for an ion implanter in which the modulating field strength created by the buncher electrode may be significantly lower than that of the accelerating alternating electric field of the linear accelerator. In this manner, the buncher electrode operates to modulate the DC ion beam (e.g., obtained from an upstream mass analysis magnet), and the drift region allows bunching to occur as a result of the modulation.

In accordance with a further aspect of the invention, there is provided a slit double gap buncher stage and a modulating electrode therefor, which provide further advantages associated with ion implantation. The modulating electrode comprises an elongated slit aperture in an electrode base extending longitudinally through the base along the ion beam path. The slit may comprise an aspect ratio greater than one, for example, in which the slit height is greater than the slit width. The slit aperture allows reduced gap lengths in the buncher compared to circular electrode apertures, resulting in efficient modulation over a wider range of ion velocities. In addition, the slit double gap buncher may be located between matching quadrupole focusing devices and an entrance aperture in a linear accelerator. In this case, the matching quadrupoles may serve to form the bunched ion beam into a circular profile for injection into the first accelerating stage, as well as to provide a buncher drift region. This provides for reduction in length for an ion implantation device.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
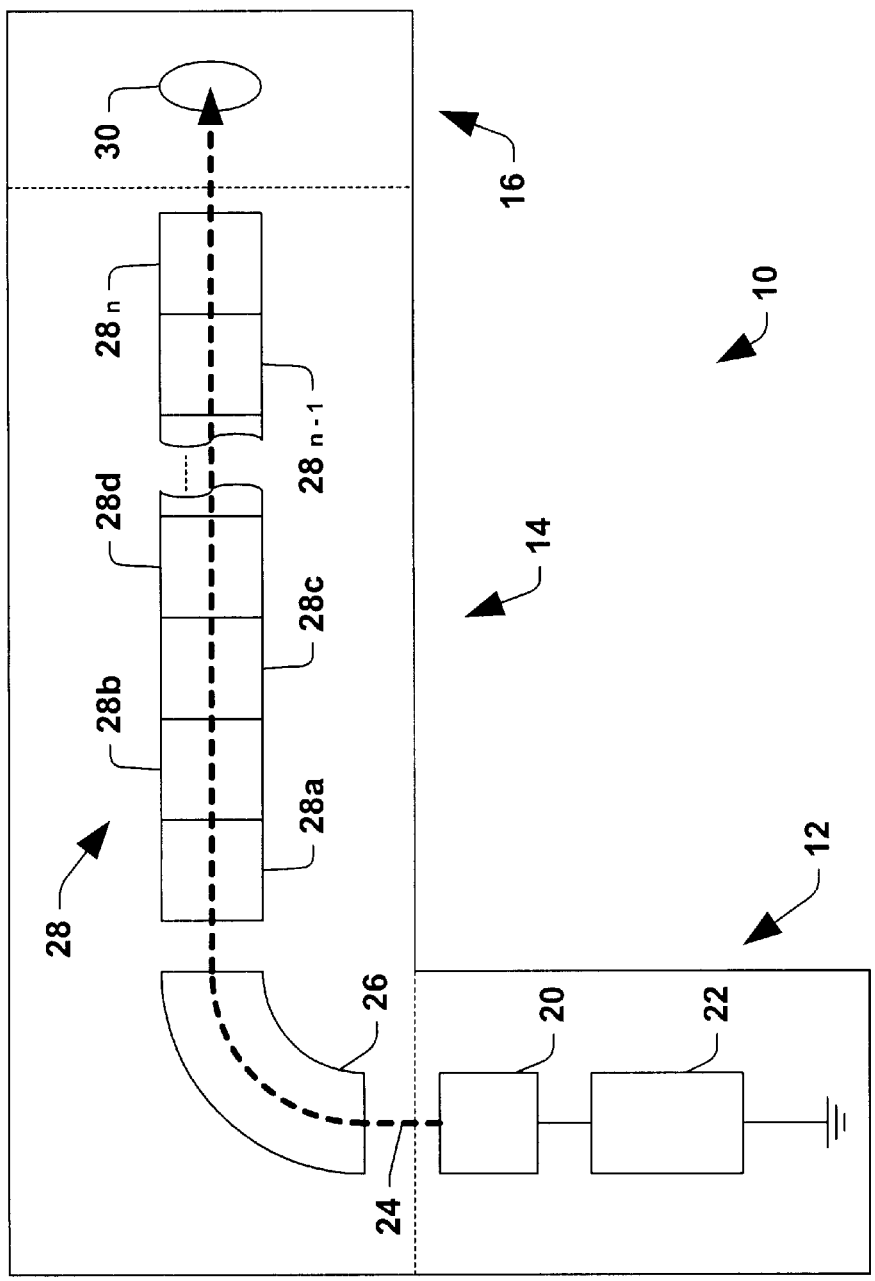
FIG. 1 is schematic a block diagram illustrating a high energy ion implanter having a linear accelerator.

The present invention will now be described with reference to the drawings wherein like reference numerals are used to refer to like elements throughout. A dedicated ion buncher stage is provided for bunching ions in an ion implantation system. The ion buncher stage may be employed in a linear accelerator upstream of an accelerating stage to provide ions thereto in bunches or packets, such that the loss of ions in the linear accelerator is reduced. The buncher stage may operate at lower energy levels than the subsequent accelerator stages, and may further provide a drift region to facilitate ion bunching. The invention further includes an asymmetrical double gap buncher stage, as well as a slit buncher stage for further improvement of ion implantation efficiency. Also described hereinafter are methods for accelerating ions in an ion implanter linear accelerator.

Figure 2:
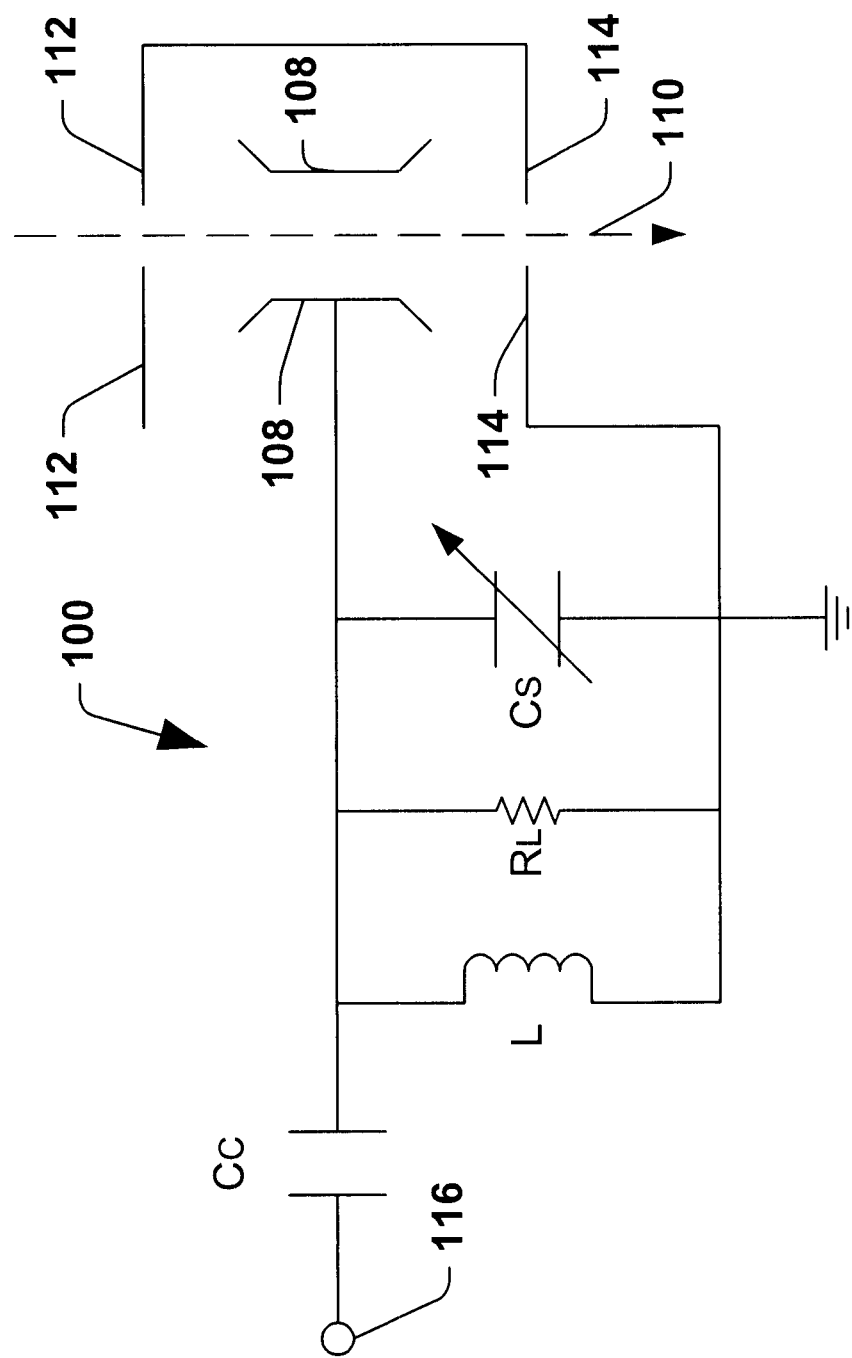
FIG. 2 is a schematic diagram illustrating a conventional linear accelerator module.

In order to provide context for the features of the invention, a brief discussion of a conventional interconnection for an RF amplifier and resonator in a linear accelerator module (e.g., modules 28a–28n of FIG. 1) is now provided. Referring now to FIG. 2, a conventional resonator circuit 100 is illustrated which includes an inductor coil L connected in parallel with a resistance $R_L$ and a capacitance $C_S$. An energizable electrode 108 is connected to the inductor L. The electrode 108 is mounted between two grounded electrodes 112 and 114, and the energizable electrode 108 and the grounded electrodes 112 and 114 operate to accelerate the ion beam 110. The capacitance $C_S$ represents the capacitance of the energizable electrode 108, and the resistance $R_L$ represents the losses associated with the resonant circuit comprising the inductor L and the capacitance $C_S$. The values for the capacitance $C_S$ and the inductor coil L are selected to form a low loss (high Q) resonant or "tank" circuit 100, wherein each accelerator module in a linear accelerator system of the type shown in FIG. 1 resonates at the same frequency. A radio frequency (RF) signal is connected from a matching network (not shown) at point 116 and is capacitively coupled to a high voltage end of the coil L via a capacitor $C_C$.

Figure 3:
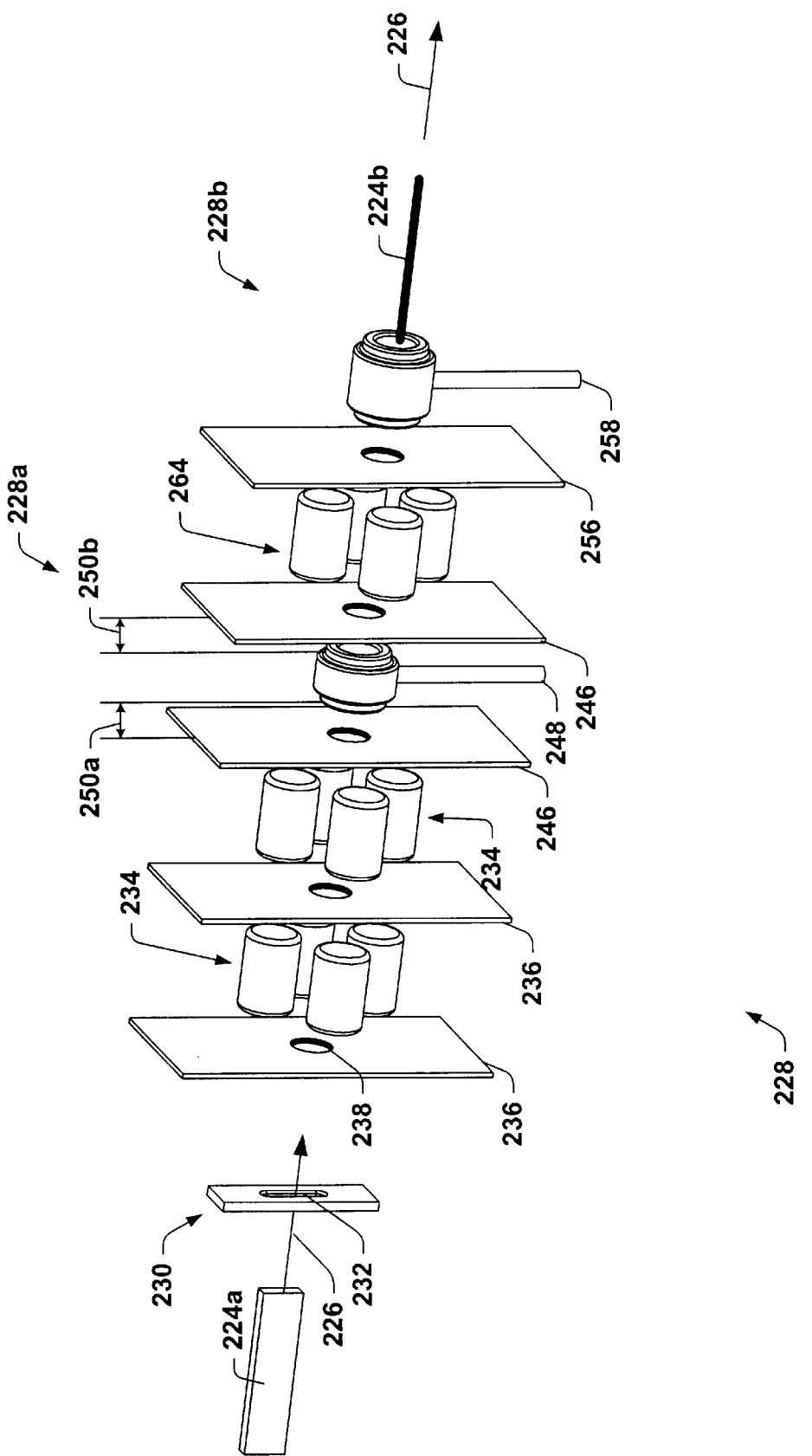
FIG. 3 is a perspective view of a portion of a linear ion accelerator which may be employed in an ion implantation system.

A perspective view of a portion of a modular linear accelerator 228 is provided in FIG. 3. A DC ion beam 224a is provided to the accelerator 228 (e.g., from an upstream mass analyzer magnet, not shown), along a beam path 226. The DC beam 224a may comprise, for example, an elongated slit profile that is passed through an entrance aperture 230 having a vertically elongated slit 232 along the path 226. The beam 224a is formed into a generally circular profile (not shown) via two sets of matching quadrupole devices 234 and corresponding grounded electrodes 236, wherein the grounded electrodes 236 each comprise a cylindrical aperture 238 located along the path 226.

The linear accelerator 228 in the present example further comprises two or more accelerating modules or stages 228a, 228b, . . . 228n, where n is an integer, two of which (e.g., stages 228a and 228b) are illustrated in FIG. 3. Each of the accelerator modules 228n further accelerates ions from the beam 224 beyond the energies they achieve from prior modules. The accelerating modules 228n may be individually energized by high RF voltages generated by a power supply and resonator (not shown). As the ion beam 224 travels through the various accelerating modules or stages 228n, some of the ions therein are accelerated, whereas others are not. The accelerating module 228a comprises a pair of grounded electrodes 246 located before and after an energizable electrode 248 along the path 226, where the energizable electrode 248 may be energized by an appropriate RF energy source and resonator (not shown) in order to achieve acceleration of ions within the beam 224a along the beam path 226. The grounded electrodes 246 are generally equally spaced from the energizable electrode 248 to provide first and second generally equal gaps 250a and 250b therebetween. Similarly, the second accelerator module or stage 228b comprises a first grounded electrode 256 located along the path 226 upstream of a second energizable electrode 258.

A quadrupole device 264 (for example, an electrostatic quadrupole) may be provided along the path 226 between the first and second accelerator stages 228a and 228b to provide for radial focusing of the beam 224 as it travels through successive accelerator stages 228. The accelerator 228 may comprise further accelerating stages or modules (not shown), whereby an ion beam 224b may be accelerated to an energy higher than that of the DC beam 224a provided to the accelerator 228.

Figure 4:
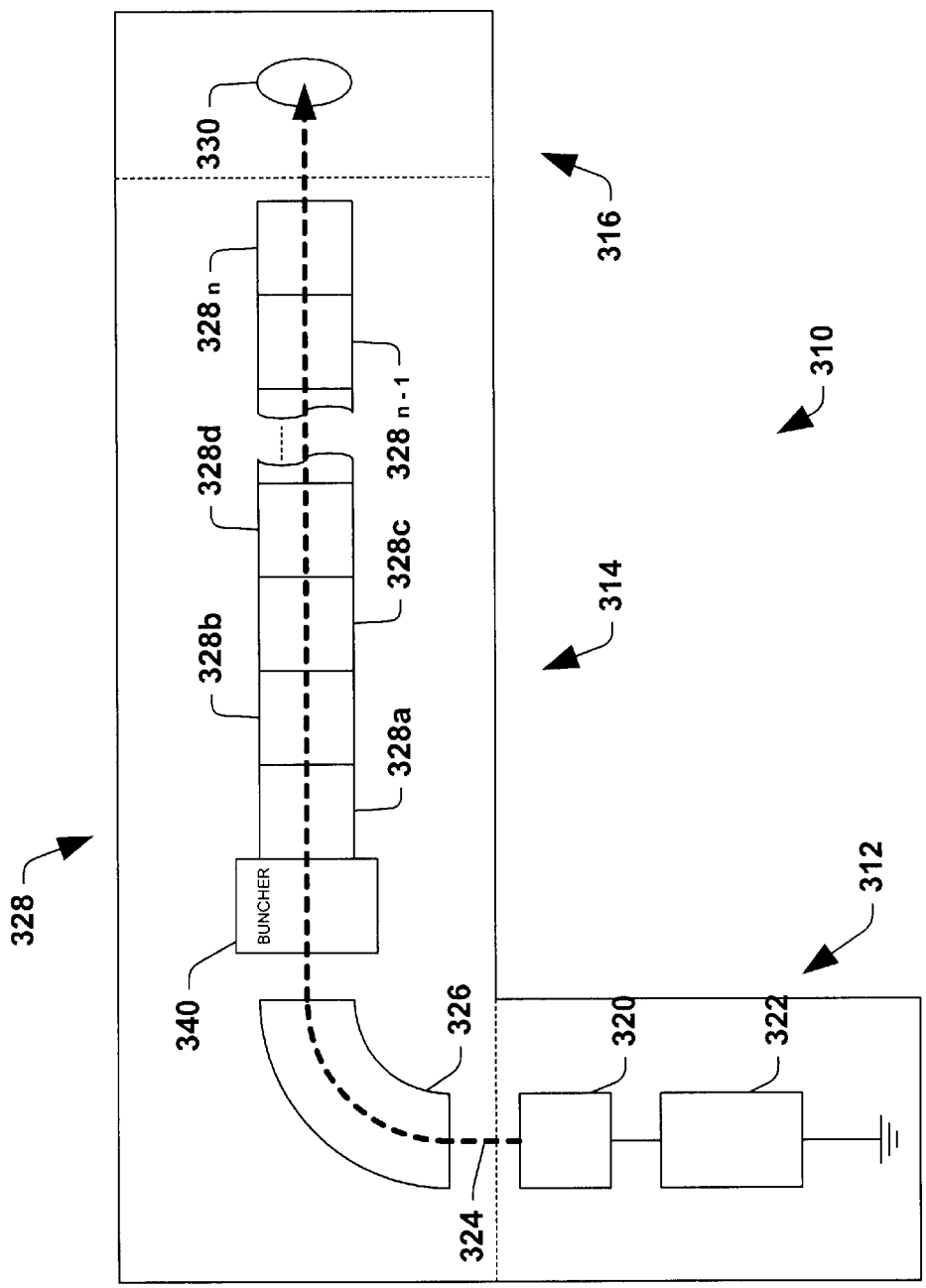
FIG. 4 is a schematic illustration of an exemplary ion implantation system having a linear accelerator and a buncher in accordance with an aspect of the invention.

Referring now to FIG. 4, an aspect of the invention provides an ion implanter 310 comprising a terminal 312, a beamline assembly 314, and an end station 316. The terminal 312 includes an ion source 320 powered by a high voltage power supply 322. The ion source 320 produces an ion beam 324 that is provided to the beamline assembly 314. The ion beam 324 is then directed toward a target wafer 330 in the end station 316. The ion beam 324 is conditioned by the beamline assembly 314 that comprises a mass analysis magnet 326 and a radio frequency (RF) linear accelerator (linac) 328. The linac 328 includes a buncher stage 340 and a series of accelerating stages or modules 328a–328n, each of which further accelerates ions beyond the energies they achieve from prior modules. The accelerating stages or modules may be individually energized by a high RF voltage that is typically generated by a resonance method to keep the required average power reasonable. The accelerating stages or modules 328a–328n in the high energy ion implanter 310, for example, individually include an RF amplifier, a resonator, and an accelerating electrode (not shown).

In accordance with one aspect of the invention, the ion buncher stage 340 is located at the front of the linear accelerator between the mass analysis magnet 326 and the first accelerating stage 328a. As illustrated and described further hereinafter, the ion buncher stage 340 may comprise a buncher electrode located along the path 324, which is operatively associated with a buncher energy source (not shown) to create a modulating alternating electric field. This modulating field operates on the DC ion beam provided by the mass analysis magnet 326 in order to provide bunched ions to the accelerating stage 328a. The implanter 310 may further comprise controls (not shown), whereby the terminal 312, beamline assembly 314, and end station 316 may be operated to affect ion implantation in the workpiece 310 in a controlled fashion. In this regard, control of the modulating field in the buncher stage 340 as well as the accelerating fields in the linac 328 may be implemented through such controls.

Figure 5:
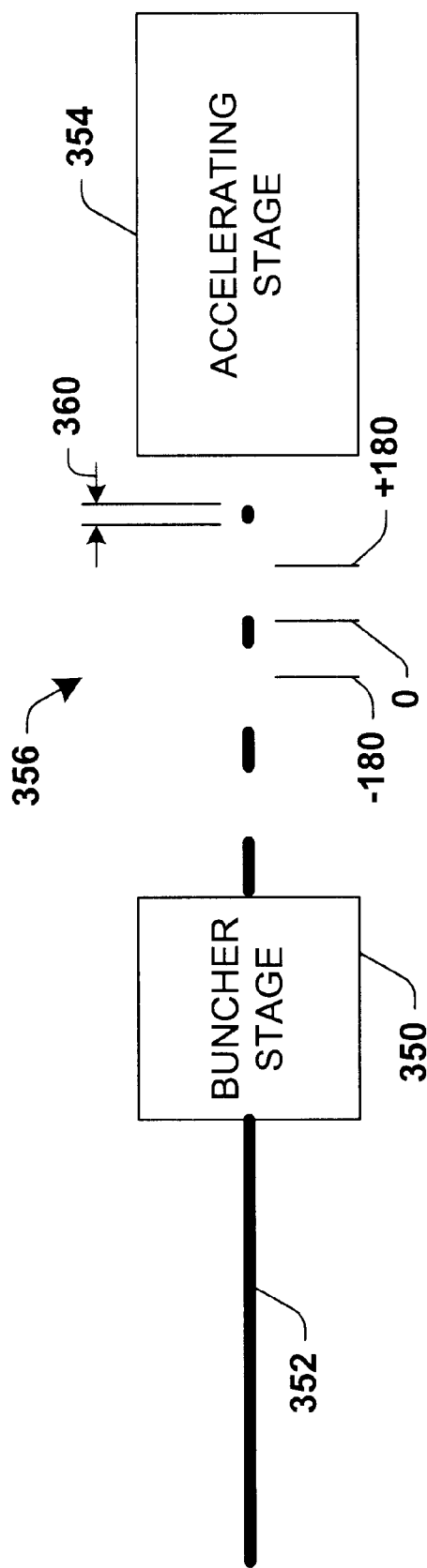
FIG. 5 is a schematic illustration of an exemplary buncher and linear accelerator according to the invention.

Referring briefly to FIG. 5, a schematic illustration is provided of an exemplary buncher stage 350 operating on a DC ion beam 352 in order to group or "packetize" ions therefrom for provision to an ion accelerating stage 354. Buncher 350 may operate in similar fashion to the buncher 340 stage of FIG. 4, and the accelerating stage 354 may operate in similar fashion to the accelerating stage 328 of FIG. 4. The buncher 350 receives the DC ion beam 352 having a uniform energy distribution and groups ions therefrom into bunches 356 of ions within a particular desired energy range, which may then be efficiently accelerated to a desired second energy (e.g., or energy range) by the accelerator 354.

Another aspect of the invention includes a single electrode buncher having an asymmetrical gap, which further facilitates improved ion transfer efficiency in ion implantation systems. As discussed above, the invention contemplates a single modulating buncher electrode, which may be located between two grounded electrodes (e.g., or grounded focusing devices, such as electrostatic quadrupoles). For instance, the buncher may comprise first and second grounded electrodes, wherein the first grounded electrode is spaced along a beam path from the buncher electrode toward an ion beam entrance end so as to define a first gap therebetween. The second grounded electrode may be spaced along the path from the buncher electrode toward the ion beam exit so as to define a second gap therebetween. According to a further aspect of the invention, one gap may be made larger than the other gap, for example, approximately ten times larger. In addition, one or both of the gaps may be mechanically or otherwise adjustable.

Figure 6:
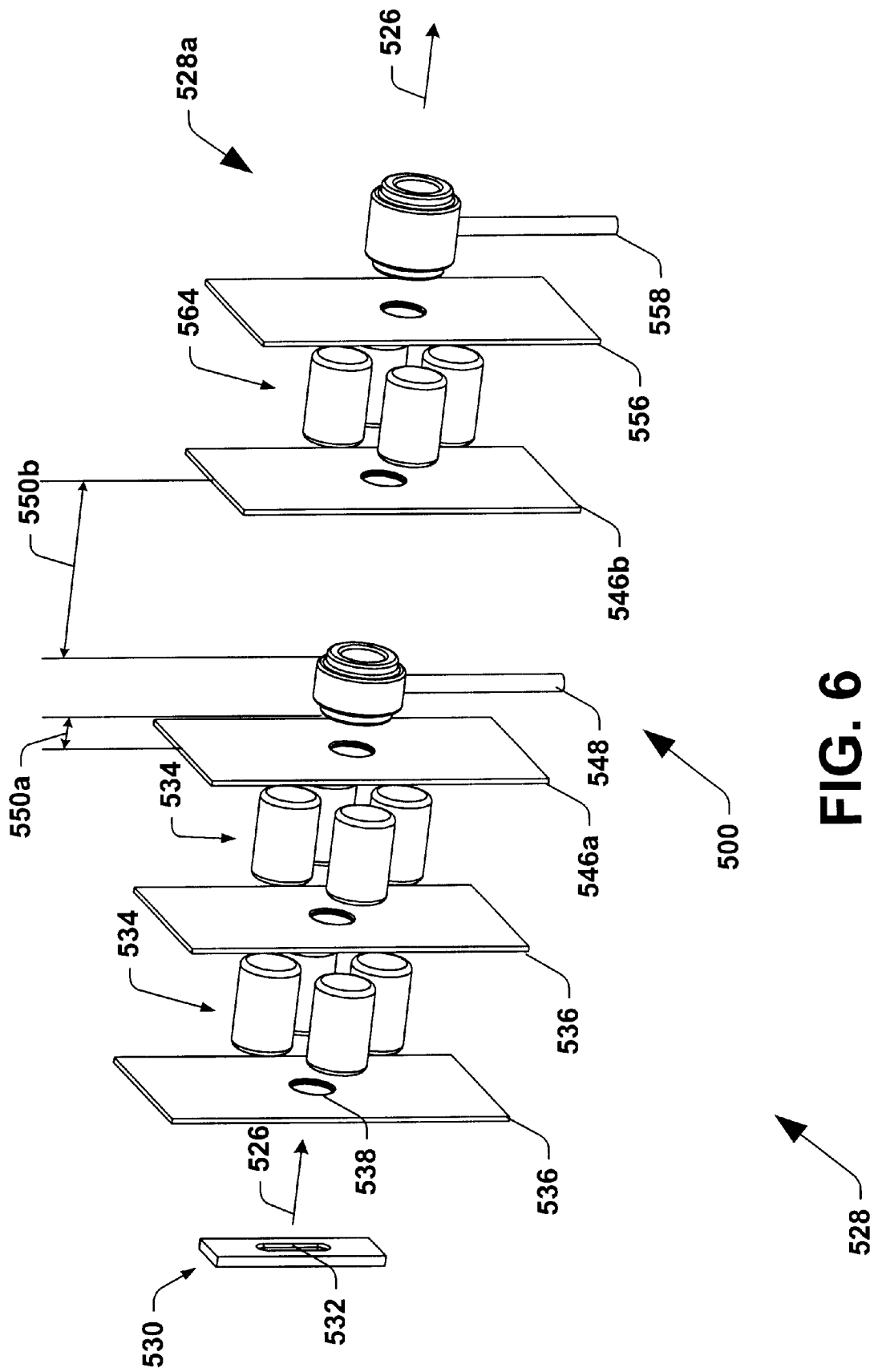
FIG. 6 is a perspective view of an exemplary asymmetrical double gap buncher in accordance with another aspect of the invention.

Referring now to FIG. 6, an exemplary double gap buncher 500 is illustrated along with various components of an ion implantation linear accelerator 528. A DC ion beam (not shown) is provided to the accelerator 528 (e.g., from an upstream mass analyzer magnet, not shown), along a beam path 526. The DC beam may comprise, for example, an elongated slit profile that is passed through an entrance aperture 530 having a vertically elongated slit 532 along the path 526. The DC beam is formed into a generally circular profile via two sets of matching quadrupole devices 534 and corresponding grounded electrodes 536, wherein the grounded electrodes 536 each comprise a cylindrical aperture 538 located along the path 526. The linear accelerator 528 further comprises the asymmetrical gap buncher 500 as well as one or more accelerating modules or stages 528n, where n is an integer, one of which (528a) is illustrated in FIG. 6. Each of the accelerating modules 528n further accelerates ions from the beam beyond the energies they achieve from prior modules.

The buncher 500 comprises a pair of grounded electrodes 546a and 546b located before and after a modulating buncher electrode 548 along the path 526, where the modulating buncher electrode 548 may be energized by an appropriate RF energy source and resonator (not shown) in order to modulate ions within the beam along the beam path 526. The grounded electrodes 546a and 546b are spaced from the modulating electrode 548 to provide first and second gaps 550a and 550b, respectively, therebetween.

One of the two gaps (e.g., the first gap 550a) has a length such that the ion transit time through the gap is small compared to the RF period associated therewith. An ion passing through this gap experiences a maximum energy change slightly less than the product of its charge and the peak RF voltage applied to the energized buncher electrode 548. The other gap (e.g., the second gap 550b) has a substantially greater length, so that the ion transit time through the gap is a large fraction of the RF period. An ion passing through this gap experiences a maximum energy change substantially less than the product of its charge and the peak RF voltage applied to the energized buncher electrode 548. Thus, most of the energy modulation of the ion beam occurs in the shorter of the two gaps.

In a conventional equal gap buncher, the maximum energy modulation in each gap is equal. In this case, the bunching efficiency depends strongly on the ion transit time from the center of one gap to the center of the other gap. Efficiency is highest when the gap-to-gap transit time is one half of an RF period, as the second gap modulation enhances the first gap modulation. Efficiency is lowest when the gap-to-gap transit time is one RF period, as the second gap modulation tends to cancel the first gap modulation. The use of unequal length gaps greatly reduces the dependence of buncher efficiency on the gap-to-gap transit time, making efficiency nearly independent of ion species.

It should be understood that wide variations in gap length may be employed and are contemplated as falling within the scope of the present invention. Conceptually, it is the asymmetry of the gaps that allows one gap to contribute to bunching and the other gap to play a lesser role than conventional, symmetrical gap systems in reducing or undoing the advantageous bunching provided by the first gap mentioned. Further, although in the above example the first gap 550a is less than the second gap 550b, it should be understood that the second gap may be made smaller than the first gap, in which case the functions thereof may switch.

It will be appreciated that one or both of the gaps 550a, 550b may be adjusted in order to tune the buncher 500 to ion species. In addition, the power source energizing the modulating electrode 548 may be adjustable (e.g., with respect to frequency, phase, amplitude, etc.) in order to provide appropriate modulation according to one or more system performance parameters. Thus, the exemplary buncher 500 is adaptable for use with accelerators and ion implantation systems optimized for accelerating and implanting specific ion species, as well as those systems wherein the accelerator itself is adjustable.

The accelerating module or stage 528a comprises a first grounded electrode 556 located along the path 526 upstream of an energizable electrode 558, as well as a second grounded electrode (not shown) downstream of the energizable electrode 558. The energizable electrode 558 may be energized by an appropriate power source and resonator (not shown) to affect acceleration of ions to a second energy level along the path 526 in a controlled fashion. A set of four focusing quadrupoles 564 may be provided along the path 526 between the buncher stage 500 of the accelerator system 528 and the first accelerator stage 528a in order to provide radial focusing of the beam as it travels through successive accelerator stages 528n. The accelerator system 528 may comprise further accelerator stages or modules 528n (not shown), whereby an accelerated ion beam may be generated at an energy level higher than that of the DC beam provided to the accelerator 528.

Figure 7:
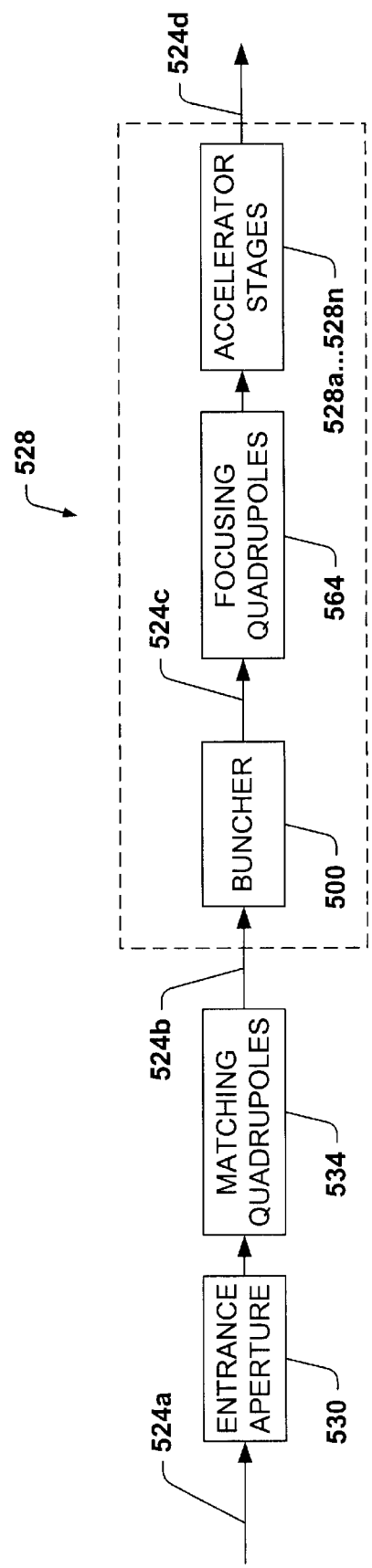
FIG. 7 is a schematic illustration of a portion of another exemplary linear accelerator in accordance with the invention.

Referring now to FIG. 7, the linear accelerator system 528 is illustrated schematically, wherein a transversely elongated DC ion beam 524a is provided to the entrance aperture 530 (e.g., having an elongated slit opening). The elongated profile of the beam 524a is shaped by matching quadrupoles 534 into a generally circular beam 524b, after which the beam 524b is provided to the exemplary buncher stage 500 of the accelerator system 528. The buncher stage 500 groups or bunches ions from the beam 524b into a bunched ion beam 524c As discussed above, the focusing quadrupoles 564 following the buncher stage 500 maintain this circular profile, and may further provide a drift region to facilitate bunching. The bunched beam 524c is then provided to the accelerating stages 528a–528n of the accelerator system 528, whereby an accelerated ion beam 524d is obtained, having an energy greater than that of the original DC beam 524a.

Figure 8:
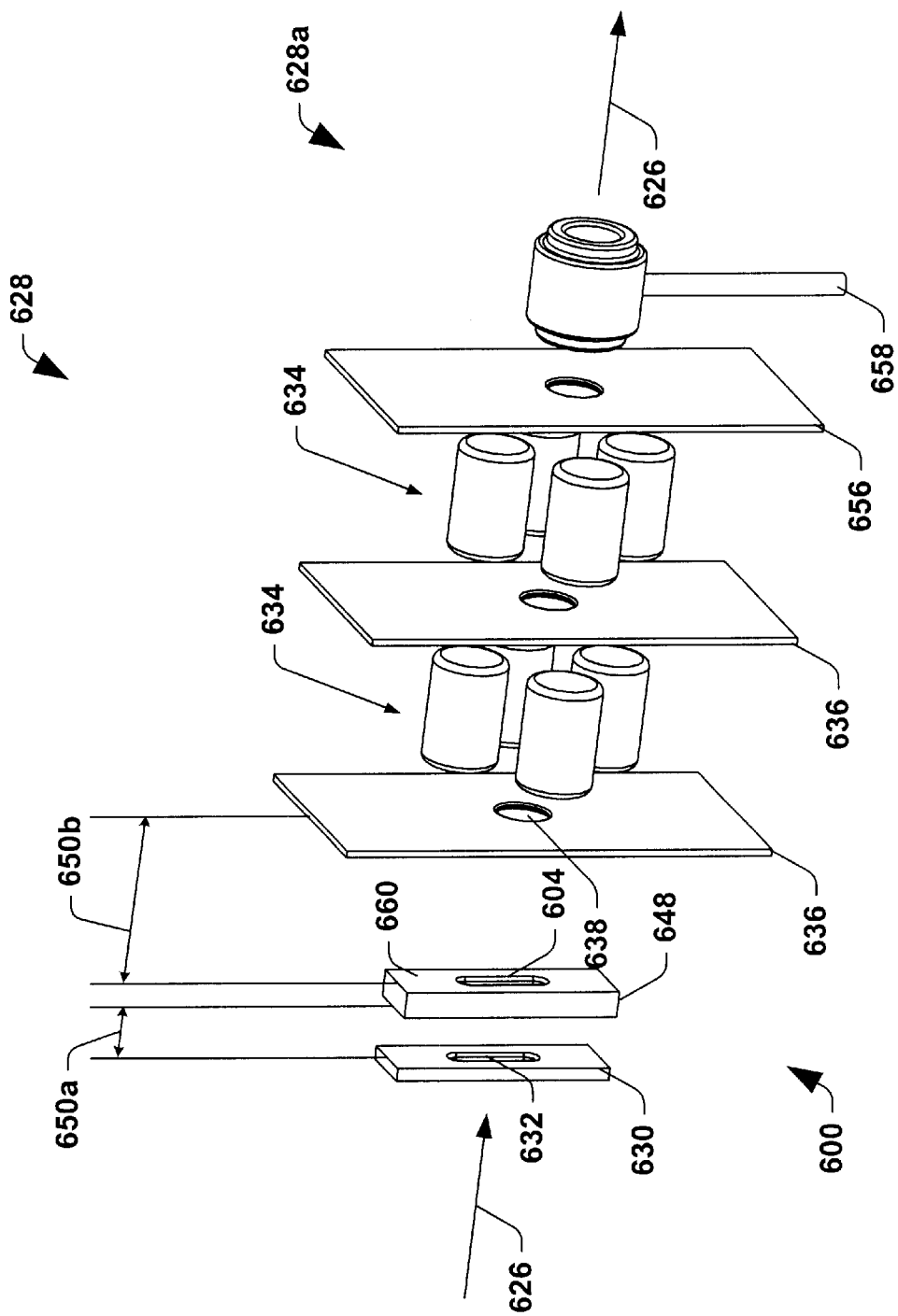
FIG. 8 is a perspective view of an exemplary slit double gap buncher in accordance with another aspect of the invention.
Figure 9:
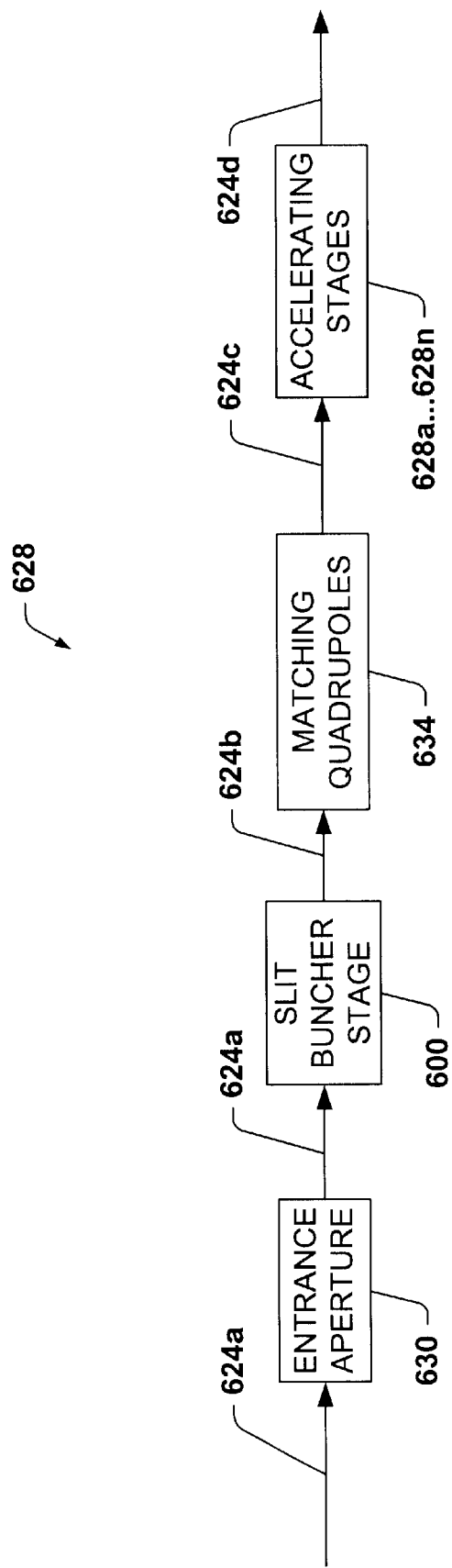
FIG. 9 is a schematic illustration of a portion of another exemplary linear accelerator in accordance with the invention.

According to another aspect of the present invention, a buncher is provided, which may operate directly on an ion beam (e.g., beam 524a) having a transversely elongated longitudinal profile. Referring now to FIGS. 8 and 9, a portion of another exemplary linear accelerator 628 is illustrated having an exemplary slit double gap buncher stage 600 of the accelerator system 628 positioned along a beam path 626 between an entrance aperture 630 having an elongated slit opening 632 therein, and subsequent matching quadrupoles 634 and associated grounded electrodes 636. One or more accelerating stages or modules 628a–628n of the accelerator system 628 are located downstream of the quadrupoles 634 along the path 626, one of which (e g., 628a) is illustrated in FIG. 8.

The exemplary slit double gap buncher 600 comprises a single modulating buncher electrode 648, which may be located between the entrance aperture 630 and a grounded electrode 636 associated with the quadrupole devices 634, wherein the electrode 648 includes a transversely elongated slit aperture 604. The buncher electrode 648 is spaced from the entrance aperture 630 so as to define a first gap 650a therebetween. The grounded electrode 636 may be spaced along the path 626 from the buncher electrode 648 toward the accelerating stage 628a so as to define a second gap 650b therebetween. According to a further aspect of the invention, the second gap 650b may be made larger than the first gap 650a to obtain the advantages associated with asymmetrical gaps highlighted above, for instance, approximately at least ten times larger than the first gap 650a. As discussed above, the asymmetry of the gaps may further be selected to be a function of the ion transit time through the gap and the modulation frequency, which dictates the modulation voltage period.

The slit aperture 604 of the modulating buncher electrode 648 allows the introduction of a ribbon shaped ion beam directly into the buncher 600 without requiring preliminary shaping (e.g., via matching quadrupole devices) into a circular profile. Thus, the buncher stage 600 may be located immediately subsequent the entrance aperture 630 along the beam path 626. This provides for a reduction in the physical length of the accelerator system 628. The elongated-profile ion beam may be thus shaped into a generally circular profile, if desired, subsequent to bunching via the slit double gap buncher 600, using the matching quadrupoles 634 and associated grounded electrodes 636 prior to introduction into the initial accelerator stage 628a. In this configuration, the quadrupoles 634 may serve both to perform radial shaping of the ion beam along the path 626, as well as to provide a drift region (e.g., or a portion thereof) along which the ions may be advantageously grouped or bunched, as discussed above.

It will be appreciated that one or both of the gaps 650a, 650b may be adjusted in order to tune the buncher stage 600 to specific ion species. In addition, the power source (not shown) energizing the modulating electrode 648 may be adjustable (e.g., with respect to frequency, phase, amplitude, etc.) in order to provide appropriate modulation according to one or more system performance parameters.

The accelerating module or stage 628a of the accelerator system 628 comprises a first grounded electrode 656 located along the path 626 upstream of an energizable electrode 658, as well as a second grounded electrode (not shown) downstream of the energizable electrode 658. The energizable electrode 658 may be energized by an appropriate power source and resonator (not shown) to affect acceleration of ions to a second energy level along the path 626 in a controlled fashion. Matching quadrupole devices 634 (e.g., electrostatic quadrupoles) may be provided along the path 626 between the buncher stage 600 and the first accelerating stage 628a in order to provide radial focusing of the beam as it travels through successive accelerator stages 628n. Thus, a bunched beam having an elongated profile from the buncher 600 may be shaped into a generally cylindrical beam via the quadrupoles 634 prior to presentation to the first accelerating stage 628a. The accelerator 628 may comprise further accelerating stages or modules 628n (not shown), whereby an accelerated ion beam may be generated at an energy level higher than that of the DC beam provided to the accelerator 628.

Referring also to FIG. 9, a transversely elongated DC ion beam 624a is provided to the entrance aperture 630 (e.g., having an elongated slit opening). The elongated beam 624a is then provided to the exemplary slit double gap buncher 600. As discussed above, the elongated aperture 604 of the buncher electrode 648 allows the buncher stage 600 to operate directly on the elongated profile DC ion beam 624a. The buncher 600 groups or bunches ions from the beam 624a into a longitudinally bunched ion beam 624b, which likewise may have an elongated profile. Thereafter, the bunched ion beam 624b is provided to the matching quadrupoles 634 along the path 626, which shape the elongated beam 624b into a circular profile ion beam 624c. As discussed above, the quadrupoles 634 following the buncher stage 600 may also operate to provide a drift region in which the bunching of ions is facilitated. The bunched beam 624c is then provided to the accelerating stages 628a–628n of the accelerator system 628, whereby an accelerated ion beam 624d is obtained, having an energy greater than that of the original DC beam 624a.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e. that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. An ion buncher for grouping ions along a path between an entrance end and an accelerating module in an ion accelerator system, the buncher comprising:
    a first grounded electrode with an elongated slit aperture, forming an entrance aperture for an ion beam with an elongated slit shaped transverse profile;
    a second grounded electrode, with either a slit aperture or circular aperture, located along the ion beam path toward the accelerating module; and
    an energizable electrode with an elongated slit aperture located between the first and second grounded electrodes and defining gaps therebetween, and operatively associated with an energy source and adapted to create a modulating electric field in the gaps between the energizable electrode and the first and second grounded electrodes, respectively, to provide bunched ions to the accelerating module.

2. The ion buncher of claim 1, wherein the slit aperture associated with the energizable electrode comprises an aspect ratio of between about 2 and about 10.

3. The ion buncher of claim 1, wherein the slit aperture associated with the energizable electrode comprises a transverse height of approximately 25 mm and a transverse width of approximately 4 mm.

4. The ion buncher of claim 1, wherein the gaps have different lengths.

5. The ion buncher of claim 4, wherein one of the gaps is adjustable.

6. The ion buncher of claim 4, wherein the energizable electrode energy source is independently adjustable to vary at least one of the frequency, phase, and field strength associated with the modulating electric field in the portion of the path.

7. The ion buncher of claim 1, wherein the gaps are selected such that one of the gaps comprises a distance sufficiently small such that the modulating electric field therein is generally uniform during a time in which an ion travels therethrough.

8. The ion buncher of claim 7, wherein the other of the gaps comprises a distance larger than the one gap, such that the modulating electric field therein varies substantially during a time in which the ion travels therethrough.

9. The ion buncher of claim 4, wherein the first grounded electrode associated with the ion buncher forms an entrance aperture for the ion accelerator system.

10. The ion buncher of claim 9, wherein an orientation of the slit associated with the first grounded electrode and the energizable electrode is the same, thereby facilitating a bunching of ions in the ion beam while the ion beam has an aspect ratio generally corresponding to the slits.

11. A linear accelerator system for accelerating ions traveling along a path from an entrance end to an exit end in an ion implantation system, the linear accelerator system comprising:
    at least one accelerating module having at least one energizable electrode operatively associated with an accelerator energy source and adapted to create a first alternating electric field to accelerate the ions from a first energy to a second energy; and
    an ion buncher for grouping ions along a path between the entrance end and the at least one accelerating module, the ion buncher comprising:
    a first grounded electrode with an elongated slit aperture, forming an entrance aperture for an ion beam with an elongated slit shaped transverse profile;
    a second grounded electrode, with either a slit aperture or circular aperture, located along the ion beam path toward the accelerating module; and
    an energizable electrode with an elongated slit aperture located between the first and second grounded electrodes and defining gaps therebetween, and operatively associated with an energy source and adapted to create a modulating electric field in the gaps between the elongated slit aperture energizable electrode and the first and second grounded electrodes, respectively, to provide bunched ions to the at least one accelerating module.

12. The linear accelerator system of claim 11, wherein the slit aperture associated with the energizable electrode comprises an aspect ratio of between about 2 and about 10.

13. The linear accelerator system of claim 11, wherein the slit aperture associated with the energizable electrode comprises a transverse height of approximately 25 mm and a transverse width of approximately 4 mm.

14. An ion implanter, comprising:
    an ion source adapted to direct charged ions having an initial energy along a path;
    a linear accelerator system having an entrance end and an exit end, comprising:

at least one accelerating module having at least one energizable electrode operatively associated with an accelerating energy source and adapted to create a first alternating electric field to accelerate the ions from a first energy to a second energy; and an ion buncher for grouping ions along a path between the entrance end and the at least one accelerating module in the linear accelerator system, the ion buncher comprising:

a first grounded electrode with an elongated slit aperture, forming an entrance aperture for an ion beam with an elongated slit shaped transverse profile;

a second grounded electrode, with either a slit aperture or circular aperture, located along the ion beam path toward the accelerating module; and an energizable electrode with an elongated slit aperture located between the first and second grounded electrodes and defining gaps therebetween, and operatively associated with an energy source and adapted to create a modulating electric field in the gaps between the energizable electrode and the first and second grounded electrodes, respectively, to provide bunched ions to the accelerating module;

an end station adapted to position a workpiece so that charged ions accelerated to the second energy impact the workpiece; and a controller coupled to the energy sources and adapted to control the relative amplitude and phase of the electric fields in the linear accelerator system.

15. The ion buncher of claim 14, wherein the gaps are selected such that one of the gaps comprises a distance sufficiently small such that the modulating electric field therein is generally uniform during a time in which an ion travels therethrough.

16. The ion buncher of claim 15, wherein the other of the gaps comprises a distance larger than the one gap, such that the modulating electric field therein varies substantially during a time in which the ion travels therethrough.

* * * * *